United States Patent
Ishizuka

(10) Patent No.: US 7,791,703 B2
(45) Date of Patent: Sep. 7, 2010

(54) INTERCONNECT SUBSTRATE FOR USE IN A LIQUID CRYSTAL MODULE, AND LIQUID CRYSTAL MODULE

(75) Inventor: Yuki Ishizuka, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 144 days.

(21) Appl. No.: 12/153,422

(22) Filed: May 19, 2008

(65) Prior Publication Data
US 2008/0291357 A1  Nov. 27, 2008

(30) Foreign Application Priority Data
May 23, 2007  (JP) .............................. 2007-136296

(51) Int. Cl.
*G02F 1/1345* (2006.01)
(52) U.S. Cl. ...................... 349/152; 349/149; 349/150; 349/151
(58) Field of Classification Search .......... 349/149–152
See application file for complete search history.

(56) References Cited

U.S. PATENT DOCUMENTS

| 2004/0075800 A1 | 4/2004 | Sah et al. ................... 349/149 |
| 2004/0183959 A1 | 9/2004 | Ishida ......................... 349/58 |
| 2005/0189594 A1 | 9/2005 | Uehara ....................... 257/359 |
| 2006/0215067 A1* | 9/2006 | Ueda et al. .................... 349/38 |
| 2007/0002243 A1 | 1/2007 | Kim ........................... 349/139 |
| 2008/0291357 A1* | 11/2008 | Ishizuka ...................... 349/58 |
| 2009/0040450 A1* | 2/2009 | Nakaminami ............... 349/152 |

FOREIGN PATENT DOCUMENTS

| JP | 3281861 B | 8/1999 |
| JP | 2000-275665 A | 10/2000 |
| JP | 2001-183689 A | 7/2001 |
| JP | 2006-195225 | 7/2006 |

* cited by examiner

*Primary Examiner*—David Nelms
*Assistant Examiner*—Phu Vu
(74) *Attorney, Agent, or Firm*—Morgan Lewis & Bockius LLP

(57) ABSTRACT

An interconnect substrate for use in a liquid crystal module is nearly rectangular in shape as seen in a plan view. Connector portions having a connector pattern that provides electrical connection between the interconnect substrate and the controller substrate are provided one for each end of the interconnect substrate in a longer-side direction thereof. A plurality of connection portions that provide connection between the interconnect substrate and the driver substrate are formed along one side of the interconnect substrate running in the longer-side direction thereof so as to be symmetrical with respect to a normal S that divides the one side into two equal parts. The conductor traces interconnecting the driver substrate and the controller substrate are formed so as to be symmetrical with respect to the normal S.

16 Claims, 3 Drawing Sheets

INTERCONNECT SUBSTRATE FOR USE IN A LIQUID CRYSTAL MODULE, AND LIQUID CRYSTAL MODULE

This application is based on Japanese Patent Application No. 2007-136296 filed on May 23, 2007, the contents of which are hereby incorporated by reference.

BACKGROUND OF THE INVENTION

1. Field of the Invention

The present invention relates to liquid crystal modules used as display devices of electronic devices such as television receivers and microcomputers. More specifically, the present invention relates to a structure of an interconnect substrate for use in a liquid crystal module, the interconnect substrate having conductor traces for interconnecting a driver substrate on which a driver element for driving a liquid crystal cell is mounted and a controller substrate on which a control circuit for controlling the driver element is mounted.

2. Description of Related Art

In recent years, display devices using a liquid crystal module have come to be used increasingly widely as display devices of electronic devices such as television receivers and microcomputers for their advantages of being thin and light-weight, and consuming a low amount of power. The liquid crystal module, in general, has a built-in backlight light source consisting of a cold cathode tube and other parts, and irradiates a forward-mounted liquid crystal cell (also called a liquid crystal panel) with light emitted from the light source and passing through an optical sheet such as a diffusing plate and a prism sheet, letting the light pass through a color filter provided in the liquid crystal cell. In this way, color images are displayed on the display surface of the liquid crystal cell.

The operation of the liquid crystal cell of the liquid crystal module is controlled by a signal, and different driver elements and substrates are attached to the liquid crystal cell (see, for example, JP-A-2006-195225 and JP-B-3281861).

FIG. 5 is a schematic plan view illustrating the relationship between a conventional liquid crystal cell and different driver elements and substrates attached thereto. As shown in FIG. 5, a plurality of COFs (chips on film) 103, each having a source driver 102 mounted thereon for feeding a signal to the source of an unillustrated thin-film transistor (TFT) provided on a glass substrate of the liquid crystal cell 101, and a plurality of COFs 105, each having a gate driver 104 mounted thereon for feeding a signal to the gate of the thin-film transistor, are connected to the conventional liquid crystal cell 101.

The COFs 103 on which the source drivers 102 are mounted are connected to an interconnect substrate 106 for a source (hereinafter a "source interconnect substrate 106"). The source interconnect substrate 106 interconnects the COFs 103 on which the source drivers 102 are mounted and a controller substrate (not shown) on which a control circuit for controlling the source drivers 102 is mounted, and conductor traces for interconnecting these two substrates are formed therein. The COFs 105 on which the gate drivers 104 are mounted are connected to an interconnect substrate 107 for a gate (hereinafter a "gate interconnect substrate 107"). The gate interconnect substrate 107 interconnects the COFs 105 on which the gate drivers 104 are mounted and a controller substrate (not shown) on which a control circuit for controlling the gate drivers 104 is mounted, and conductor traces for interconnecting these two substrates are formed therein.

This is the structure of the conventional liquid crystal cell 101. Incidentally, due to a recent increase in demand for larger liquid crystal displays, the interconnect substrates 106 and 107 provided in the liquid crystal cell 101 are getting longer and longer. However, as the interconnect substrates 106 and 107 provided in the liquid crystal cell 101 become longer, problems arise, such as greater difficulty in handling them. It is for this reason that the interconnect substrates 106 and 107 have conventionally been divided into a plurality of parts. In particular, since the source interconnect substrate 106 is long in an X direction (see FIG. 5), which is a longer-side direction of the liquid crystal cell 101, the source interconnect substrate 106 may be divided into two interconnect substrates, of which one is a left-side interconnect substrate and the other is a right-side interconnect substrate. It is to be noted that, when the liquid crystal cell 101 shown in FIG. 5 is viewed from the front (from the side on which the display surface is located), the interconnect substrate disposed on the left side of a center line C and the interconnect substrate disposed on the right side thereof are the left-side interconnect substrate and the right-side interconnect substrate, respectively.

However, when the source interconnect substrate 106 provided in the liquid crystal cell 101 is divided into two interconnect substrates, of which one is a left-side interconnect substrate and the other is a right-side interconnect substrate, and the resultant interconnect substrates are disposed in position, the left-side interconnect substrate and the right-side interconnect substrate have to be produced separately. This unfavorably reduces production efficiency. This drawback will be described with reference to FIGS. 6A and 6B.

FIGS. 6A and 6B are schematic plan views showing the structures of two conventional interconnect substrates, of which one is a left-side interconnect substrate 106a (hereinafter an "L-side interconnect substrate 106a") and the other is a right-side interconnect substrate 106b (hereinafter an "R-side interconnect substrate 106b"), into which the source interconnect substrate 106 is divided. FIG. 6A is a diagram showing the L-side interconnect substrate 106a, and FIG. 6B is a diagram showing the R-side interconnect substrate 106b.

As shown in FIGS. 6A and 6B, the L-side interconnect substrate 106a and the R-side interconnect substrate 106b each include conductor traces (not shown) for interconnecting the aforementioned source driver 102 and controller substrate, a connector portion 111 having a connector pattern that provides electrical connection between the interconnect substrate and the controller substrate, connection portions 112 connected to the COFs 103 on which the source drivers 102 are mounted, and a terminating resistor portion 113 in which a terminating resistor connected to the ends of the conductor traces is disposed.

However, if the connector portion 111 and the terminating resistor portion 113 are formed in the right and left sides, respectively, of the L-side interconnect substrate 106a, they are formed in reverse positions in the R-side interconnect substrate 106b, and vice versa. As a result, the L-side interconnect substrate 106a and the R-side interconnect substrate 106b differ from each other in the configuration of the conductor traces for interconnecting the source driver 102 and the controller substrate.

The conventional L-side interconnect substrate 106a and R-side interconnect substrate 106b shown in FIGS. 6A and 6B are each secured, for example, to a rear frame (not shown) disposed behind the liquid crystal cell 101 (behind the display surface of the liquid crystal cell 101) by three screws. The L-side interconnect substrate 106a and the R-side interconnect substrate 106b differ from each other also in the positions of screw holes 114 through which the screws are placed (in the position of the middle of the three screw holes 114, the one encircled with dashed lines in FIGS. 6A and 6B).

Therefore, conventionally, it is necessary to produce the L-side interconnect substrate 106a and the R-side interconnect substrate 106b separately, and manage their parts separately. This reduces the efficiency of producing liquid crystal modules, resulting in an increase in workload and costs.

SUMMARY OF THE INVENTION

In view of the problems described above, an object of the present invention is to provide interconnect substrates for use in a liquid crystal module, the interconnect substrates, two of them being disposed side by side along one side of a liquid crystal cell, that can be used both as a right-side interconnect substrate and a left-side interconnect substrate. Another object of the present invention is to provide liquid crystal modules that are provided with such interconnect substrates and can be produced with efficiency accordingly.

To achieve the above object, according to one aspect of the present invention, an interconnect substrate for use in a liquid crystal module is provided with: conductor traces interconnecting a driver substrate on which a driver element for driving a liquid crystal cell is mounted and a controller substrate on which a control circuit for controlling the driver element is mounted; a connector portion having a connector pattern that provides electrical connection between the interconnect substrate and the controller substrate; and a plurality of connection portions that provide connection between the interconnect substrate and the driver substrate. Here, the interconnect substrate is nearly rectangular in shape as seen in a plan view. The connector portion includes two connector portions, one for each end of the interconnect substrate in a longer-side direction thereof. The plurality of connection portions are formed along one side of the interconnect substrate running in the longer-side direction thereof so as to be symmetrical with respect to a normal that divides the one side into two equal parts. The conductor traces are formed so as to be able to interconnect the driver substrate and the controller substrate regardless of which of the two connector portions is used.

With this structure, in a case where there is a need to dispose two interconnect substrates side by side along one side of the liquid crystal cell, it is possible to provide connection between the driver substrate and the interconnect substrate and connection between the controller substrate and the interconnect substrate regardless of whether the interconnect substrate is disposed as a right- or left-side interconnect substrate. In this way, the interconnect substrate can appropriately interconnect the driver substrate and the controller substrate. That is, it is possible to provide the interconnect substrates, two of them being disposed side by side along one side of the liquid crystal cell, that can be used both as the right-side interconnect substrate and the left-side interconnect substrate. This eliminates the need for producing the right-side interconnect substrate and the left-side interconnect substrate separately as in the conventional example, making it possible to increase production efficiency and reduce the production costs.

Preferably, in the interconnect substrate structured as described above, the conductor traces are formed so as to be symmetrical with respect to the normal. With this structure, when providing the interconnect substrates, two of them being disposed side by side along one side of the liquid crystal cell, that can be used both as the right-side interconnect substrate and the left-side interconnect substrate, it is possible to prevent the conductor traces formed in the interconnect substrate from becoming complicated.

In the interconnect substrate structured as described above, terminating resistor portions, each having a terminating resistor disposed therein and connected to the ends of the conductor traces, may be provided one for each end of the interconnect substrate in the longer-side direction thereof. With this structure, if the terminating resistor is disposed as a surface-mounted component for impedance matching, it is possible to easily provide the interconnect substrates, two of them being disposed side by side along one side of the liquid crystal cell, that can be used both as the right-side interconnect substrate and the left-side interconnect substrate.

In the interconnect substrate structured as described above, a screw hole is formed so as to allow the interconnect substrate to be secured by a screw to part of components constituting a liquid crystal module. The screw hole may include a plurality of screw holes, so as to allow the interconnect substrate to be secured by a screw regardless of whether the interconnect substrate is disposed in a first position in which one of the two connector portions is used or in a second position in which another of the two connector portions is used. With this structure, even when the positions of screw holes required for the interconnect substrate used as the right-side interconnect substrate are different from those required for the interconnect substrate used as the left-side interconnect substrate, it is possible to provide the interconnect substrates, two of them being disposed side by side along one side of the liquid crystal cell, that can be used both as the right-side interconnect substrate and the left-side interconnect substrate.

To achieve the above object, according to another aspect of the present invention, a liquid crystal module is provided with the interconnect substrate structured as described above. With this structure, unlike the conventional example, there is no need to produce two types of interconnect substrate separately as an interconnect substrate of the liquid crystal module. This helps increase production efficiency and reduce the production costs.

The liquid crystal module structured as described above may be provided with a liquid crystal cell that is nearly rectangular in shape, and the interconnect substrate may include two interconnect substrates disposed side by side along one side of the liquid crystal cell running in a longer-side direction thereof. Currently, two interconnect substrates are usually disposed side by side along one side of the liquid crystal cell running in the longer-side direction (X direction) thereof. Therefore, it is possible to increase the efficiency of producing the liquid crystal module structured as described above, and reduce the production costs thereof.

DETAILED DESCRIPTION OF PREFERRED EMBODIMENTS

Hereinafter, an embodiment of an interconnect substrate for use in a liquid crystal module and a liquid crystal module of the present invention will be described with reference to the accompanying drawings. It is to be understood that the present invention is not limited in any way by the embodiment described below, because this embodiment is merely an example of how the invention can be implemented.

Figure 1:
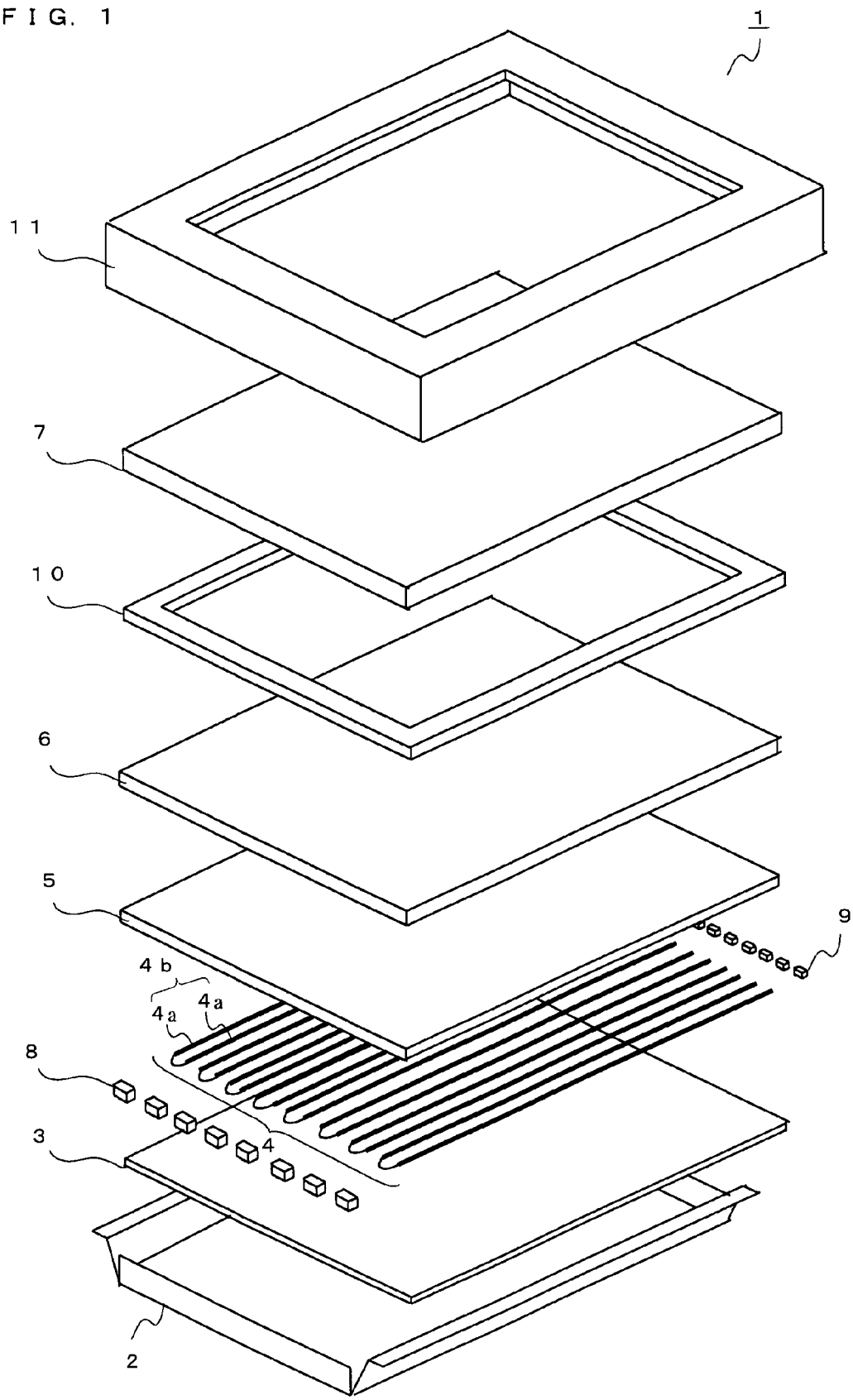
FIG. 1 is an exploded perspective view showing the structure of an embodiment of a liquid crystal module according to the invention, the liquid crystal module having an interconnect substrate for use in a liquid crystal module.

FIG. 1 is an exploded perspective view showing the structure of an embodiment of a liquid crystal module according to the invention, the liquid crystal module having an interconnect substrate for use in a liquid crystal module. With reference to FIG. 1, the overall structure of a liquid crystal module 1 of the invention will be described. The liquid crystal module 1 of this embodiment includes a rear frame 2, a reflective sheet 3, a light source 4 for backlighting (hereinafter a "backlight light source 4"), a diffusing plate 5, an optical sheet 6, and a liquid crystal cell 7.

The rear frame 2 is made of metal, and is so configured as to accommodate the reflective sheet 3 and the backlight light source 4. The reflective sheet 3 is made of an insulating white synthetic resin sheet, and is placed on the rear frame 2. This reflective sheet 3 is provided for reflecting light emitted from the backlight light source 4.

The backlight light source 4 is built with a plurality of linear light sources 4a. In the liquid crystal module 1 of this embodiment shown in FIG. 1, the number of linear light sources 4a is 16. Specifically, the linear light sources 4a are each a cathode fluorescent lamp (CCFL); in the liquid crystal module 1, two of them form one CCFL 4b. That is, two linear light sources 4a are connected together at one end thereof so as to form one U-shaped CCFL 4b.

This U-shaped CCFL 4b is supported at one end thereof by a lamp holder 8 formed of an elastic member such as silicon rubber, and is inserted at the other end thereof into a lamp socket 9, via which the CCFL 4b is connected to an unillustrated inverter circuit. The U-shaped CCFL 4b is driven by applying an alternating-current voltage of one phase to one end of the U-shaped CCFL 4b and an alternating-current voltage of opposite phase to the other end thereof.

The diffusing plate 5 diffuses light that has been emitted from the backlight light source 4 and shone directly thereon, and light that has been emitted from the backlight light source 4, reflected from the reflective sheet 3, and then shone thereon. The optical sheet 6 also diffuses light shone thereon, because it includes a diffusing sheet that diffuses light. In this way, variations in brightness, for example, are corrected. The diffusing plate 5 and the optical sheet 6 are pressed against the rear frame 2 by a cell guide 10.

The liquid crystal cell 7 is placed above the optical sheet 6. The liquid crystal cell 7 has a well-known structure including, for example, a pair of polarizing filters, a pair of glass substrates formed between the polarizing filters, a liquid crystal laid in between the glass substrates, a transparent electrode, and a color filter. The liquid crystal cell 7 is fixed in a position by the cell guide 10, and is secured by a bezel 11.

This is the end of the description of the overall structure of the liquid crystal module 1 of this embodiment. One feature of the liquid crystal module 1 of this embodiment lies in an interconnect substrate (not shown in FIG. 1) attached to the liquid crystal cell 7. Hereinafter, this feature will be described with reference to FIGS. 2, 3, and 4.

Figure 2:
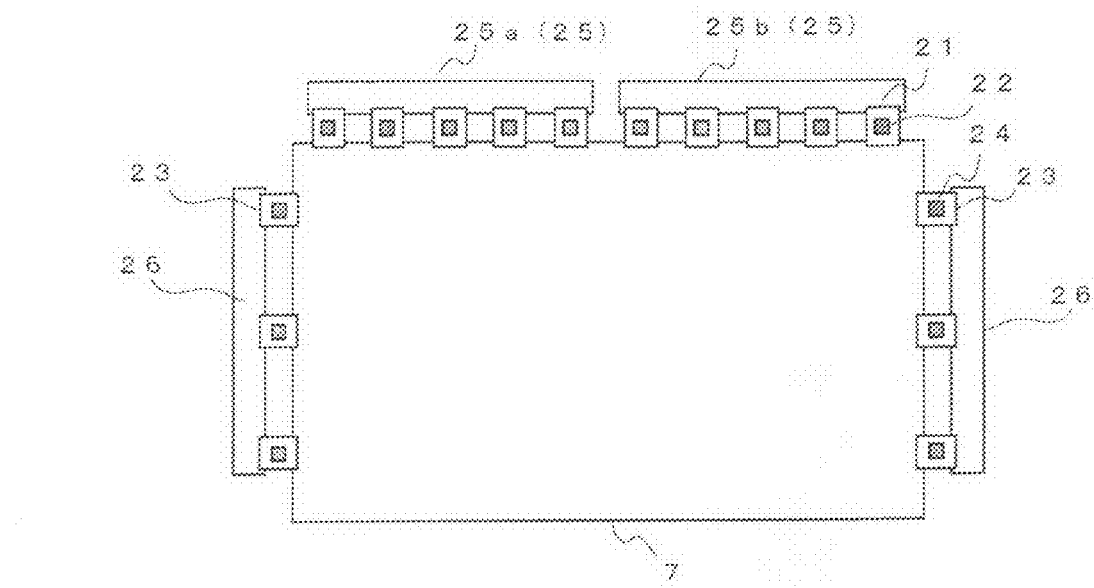
FIG. 2 is a schematic plan view illustrating the relationship between the liquid crystal cell and interconnect substrates provided in the liquid crystal module of this embodiment.
Figure 3:
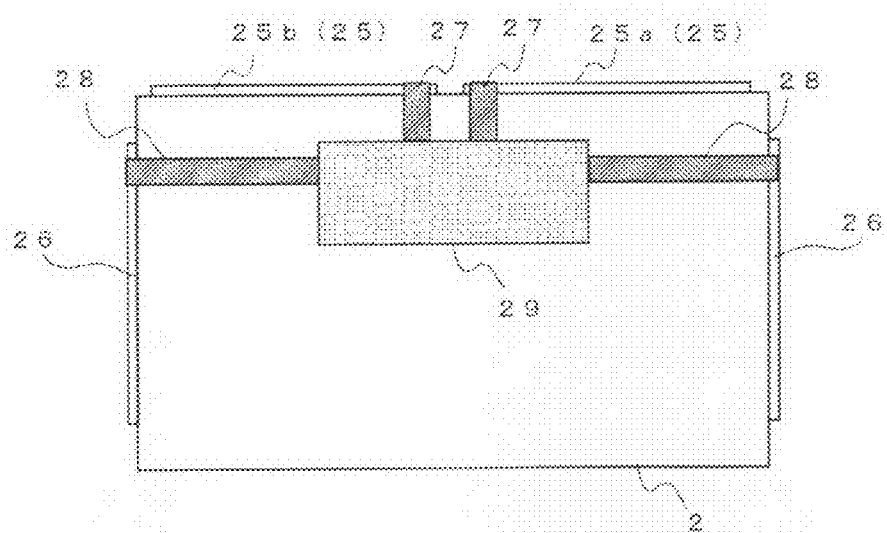
FIG. 3 is a diagram illustrating the relationship between the interconnect substrates and a controller substrate in the liquid crystal module of this embodiment.
Figure 4:
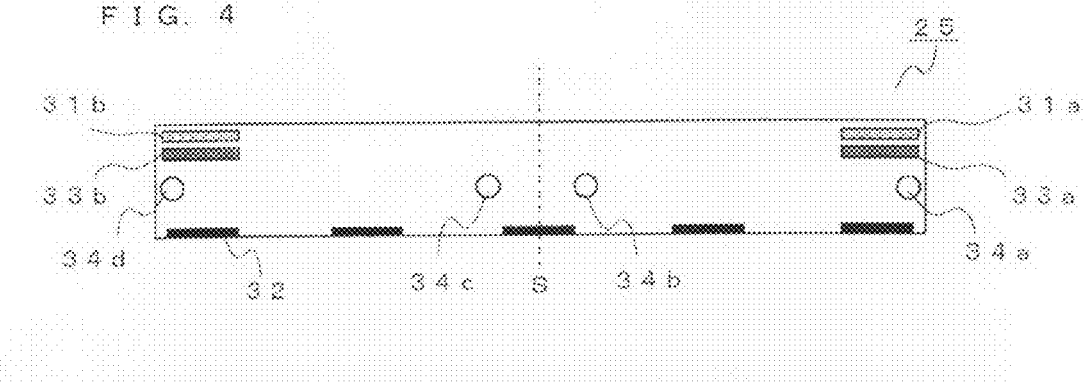
FIG. 4 is a schematic plan view showing the structure of the interconnect substrate provided in the liquid crystal module of this embodiment.
Figure 5:
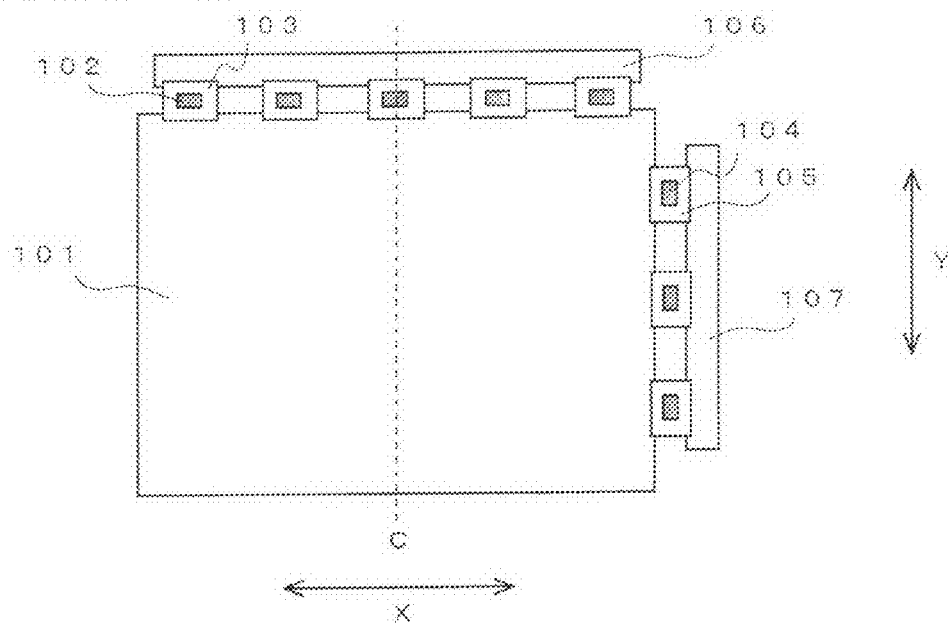
FIG. 5 is a schematic plan view illustrating the relationship between a conventional liquid crystal cell and different driver elements and substrates attached thereto.
Figure 6A:
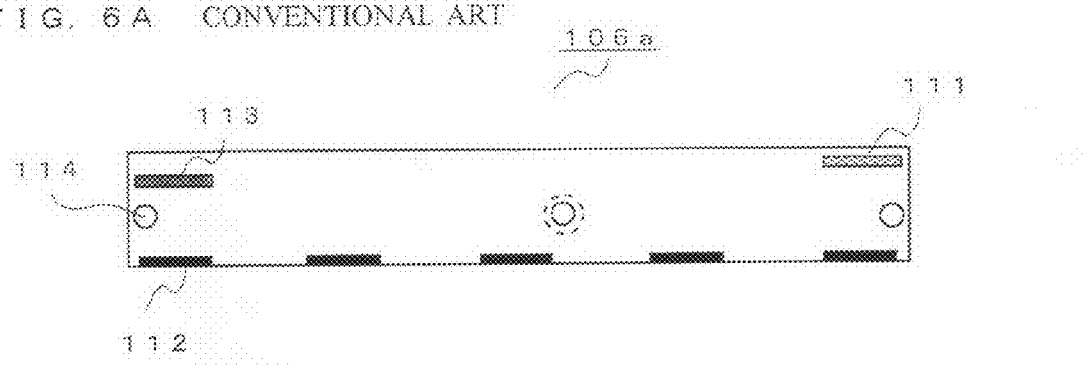
FIG. 6A is a schematic plan view showing the structure of a conventional left-side interconnect substrate.
Figure 6B:
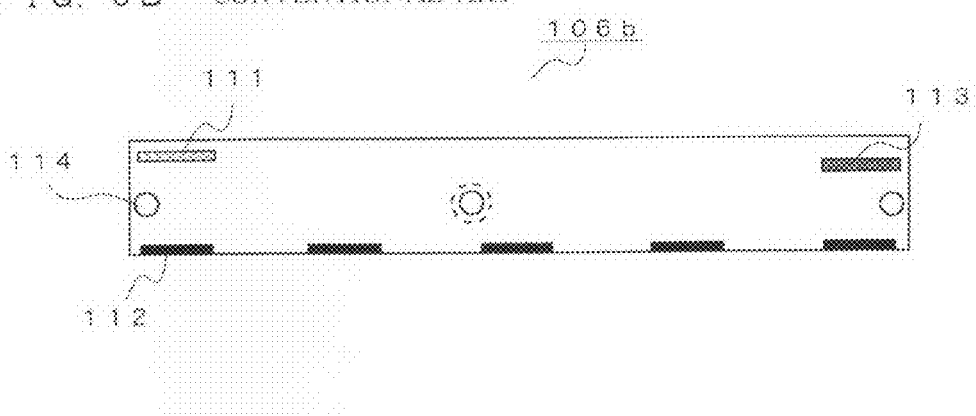
FIG. 6B is a schematic plan view showing the structure of a conventional right-side interconnect substrate.

FIG. 2 is a schematic plan view illustrating the relationship between the liquid crystal cell 7 and interconnect substrates provided in the liquid crystal module 1 of this embodiment. FIG. 3 is a schematic plan view, as seen from the side of the rear frame 2, illustrating the relationship between the interconnect substrates and a controller substrate in the liquid crystal module of this embodiment. FIG. 4 is a schematic plan view showing the structure of an interconnect substrate for a source (hereinafter a "source interconnect substrate") provided in the liquid crystal module of this embodiment.

As shown in FIG. 2, ten COFs (chips on film) 21 are connected at one end thereof to one side (in FIG. 2, an upper side) of the liquid crystal cell 7, which is nearly rectangular in shape, the one side running in the longer-side direction thereof, by using ACF (anisotropic conductive film), for example. In addition, three COFs 23 are connected at one end thereof to both sides of the liquid crystal cell 7 running in the shorter-side direction thereof by ACF, for example.

The COFs 21 connected to the one side of the liquid crystal cell 7 running in the longer-side direction thereof each have a source driver 22 mounted thereon and connected thereto by ACF, for example, the source driver 22 for feeding a signal to the source of a thin-film transistor (TFT; not shown) formed on the glass substrate of the liquid crystal cell 7. In addition, the COFs 23 connected to both sides of the liquid crystal cell 7 running in the shorter-side direction thereof each have a gate driver 24 mounted thereon and connected thereto by ACF, for example, the gate driver 24 for feeding a signal to the gate of the thin-film transistor.

Of the COFs 21 connected to the one side of the liquid crystal cell 7 running in the longer-side direction thereof, five of them disposed on the left are connected at one end thereof to an L-side interconnect substrate 25a by soldering, for example, and another five disposed on the right are connected at one end thereof to an R-side interconnect substrate 25b by soldering, for example. The COFs 23 connected to both sides of the liquid crystal cell 7 running in the shorter-side direction thereof are connected at one end thereof to interconnect substrates 26 for a gate (hereinafter "gate interconnect substrates 26") by soldering, for example.

A controller substrate 29 having a control circuit formed thereon for controlling the source driver 22 and the gate driver 24 is attached to a surface of the rear frame 2, the surface facing away from a surface thereof on which the liquid crystal cell 7 is placed. The controller substrate 29 is connected to the source interconnect substrates 25 and the gate interconnect substrates 26 via connecting members 27 and 28 formed as flat cables or the like. That is, the source interconnect substrate 25 interconnects the COF 21 on which the source driver 22 is mounted and the controller substrate 29, and the gate interconnect substrate 26 interconnects the COF 23 on which the gate driver 24 is mounted and the controller substrate 29.

Incidentally, as the liquid crystal cell 7 becomes larger, problems arise, such as a greater difficulty in handling a single source interconnect substrate and a single gate interconnect substrate. To solve such problems, the source interconnect substrate 25 disposed along one side of the liquid crystal cell 7 running in the longer-side direction thereof is divided into two interconnect substrates, of which one is the L-side interconnect substrate 25a and the other is the R-side interconnect substrate 25b, and the gate interconnect substrate 26 is disposed along both sides of the liquid crystal cell 7 running in the shorter-side direction thereof.

Conventionally, in a case where the source interconnect substrate 25 disposed along one side of the liquid crystal cell 7 running in the longer-side direction thereof is divided into two interconnect substrates, of which one is the L-side interconnect substrate 25a and the other is the R-side interconnect substrate 25b, as mentioned earlier, it is necessary to produce L-side and R-side interconnect substrates having different structures. However, in the liquid crystal module 1 of this embodiment, a common structure is adopted as the structure of the L-side interconnect substrate 25a and the R-side interconnect substrate 25b, and an interconnect substrate having this common structure can be disposed both on the left and right. Hereinafter, a description will be given of the structure of the source interconnect substrate 25 having this common structure.

As shown in FIG. 4, the source interconnect substrate 25 of this embodiment is a substrate which is nearly rectangular in shape as seen in a plan view. In this embodiment, the source interconnect substrate 25 is a four-layered substrate. In each layer of the source interconnect substrate 25, conductor traces for interconnecting the COFs 21 and the controller substrate 29 are formed. The conductor traces formed in the source interconnect substrate 25 are formed so as to be symmetrical with respect to a normal S that divides the source interconnect substrate 25 (one side of the source interconnect substrate 25 running) in the longer-side direction thereof into two equal parts. By doing so, it is possible to attain common conductor traces, and prevent them from becoming complicated.

This embodiment deals with a four-layered substrate as an example of the source interconnect substrate 25. However, the source interconnect substrate 25 used in the present invention is not limited to a multilayer substrate, but may be of any other type, such as a single-layer substrate. In addition, in a case where the multilayer substrate is adopted, the number of layers thereof is not limited in any way by this embodiment; any number of layers may be formed.

At both ends of the source interconnect substrate 25 in the longer-side direction thereof, connector portions 31 a and 31 b are disposed so as to be symmetrical with respect to the normal S, the connector portions 31 a and 31 b in which a connector pattern that provides electrical connection between the source interconnect substrate 25 and the controller substrate 29 is formed. In addition, along one side (in FIG. 4, a lower side) of the source interconnect substrate 25 running in the longer-side direction thereof, connection portions 32 (in this embodiment, five of them) in which a connecting terminal is exposed are formed so as to be symmetrical with respect to the normal S that divides the one side into two equal parts. This provides connection between the source interconnect substrate 25 and the COFs 21.

At both ends of the source interconnect substrate 25 in the longer-side direction thereof, terminating resistor portions 33a and 33b are disposed so as to be symmetrical with respect to the normal S, the terminating resistor portions 33a and 33b in which a terminating resistor connected to the ends of the conductor traces formed in the source interconnect substrate 25 is disposed. In this embodiment, the terminating resistor is provided for impedance matching. Furthermore, the source interconnect substrate 25 is provided with four screw holes 34a to 34d for securing the source interconnect substrate 25 to the rear frame 2 (see FIG. 3).

As a result of the source interconnect substrate 25 of this embodiment being structured as described above, it can be used as both the L-side source interconnect substrate and the R-side source interconnect substrate. Hereinafter, how to use the source interconnect substrate 25 of this embodiment will be described, because the source interconnect substrate 25 is used differently depending on whether it is disposed on the left or right.

In a case where the source interconnect substrate 25 having a common structure is used as a left-side interconnect substrate (in a case where it is used as the L-side interconnect substrate 25a), the connector portion 31 a disposed on the right side of the source interconnect substrate 25 is used. As a result, a connector, which is a surface-mounted component, is attached to the connector portion 31a, and the connector portion 31a is connected to the conductor traces formed in the source interconnect substrate 25. In this case, the ends of the conductor traces formed in the source interconnect substrate 25 are located on the left side of the source interconnect substrate 25. Therefore, a resistor is mounted on the terminating resistor portion 33b, and the conductor traces are connected to the terminating resistor.

In this embodiment, in a case where the source interconnect substrate 25 is disposed as a left-side interconnect substrate, the screw holes 34a, 34b, and 34d coincide with unillustrated screw holes formed in the rear frame 2. Therefore, the source interconnect substrate 25 is secured by screws placed through the screw holes 34a, 34b, and 34d.

On the other hand, in a case where the source interconnect substrate 25 having a common structure is used as a right-side interconnect substrate, the connector portion 31b disposed on the left side of the source interconnect substrate 25 is used. As a result, a connector, which is a surface-mounted component, is attached to the connector portion 31b, and the connector portion 31b is connected to the conductor traces formed in the source interconnect substrate 25. In this case, the ends of the conductor traces formed in the source interconnect substrate 25 are located on the right side of the source interconnect substrate 25. Therefore, a resistor is mounted on the terminating resistor portion 33a, and the conductor traces are connected to the terminating resistor.

In this embodiment, in a case where the source interconnect substrate 25 is disposed as a right-side interconnect substrate, the screw holes 34a, 34c, and 34d coincide with unillustrated screw holes formed in the rear frame 2. Therefore, the source interconnect substrate 25 is secured by screws placed through the screw holes 34a, 34c, and 34d.

As described above, even when two interconnect substrates are disposed side by side along one side of the liquid crystal cell 7 running in the longer-side direction thereof, the use of the source interconnect substrate 25 of this embodiment eliminates the need for producing two types of interconnect substrate separately. This helps increase the efficiency of producing source interconnect substrates, and save the time and labor of managing the parts thereof. As a result, the use of the source interconnect substrate of this embodiment makes it possible to increase the efficiency of producing the liquid crystal module 1, and reduce the production costs thereof.

This embodiment deals with a case in which an extra screw hole is formed, because the positions of screw holes required for the source interconnect substrate 25 used as a right-side interconnect substrate are different from those required for the source interconnect substrate 25 used as a left-side interconnect substrate. It is needless to say that, if the positions of screw holes required for the source interconnect substrate 25 disposed as a right-side interconnect substrate are the same as those required for the source interconnect substrate 25 disposed as a left-side interconnect substrate, there is no need to form an extra screw hole.

This embodiment deals with a case in which the surface-mounted components mounted on the source interconnect substrate 25 include a connector and a terminating resistor. It is to be understood, however, that the surface-mounted component is not limited to the example specifically described above. The invention may be practiced in any other manner than specifically described above, with any modification or variation made within the spirit of the invention. For example, no terminating resistor may be disposed, or an extra surface-mounted component such as a resistor or a capacitor may be mounted. In the latter case, for example, surface-mounted component portions in which a surface-mounted component is disposed may be formed so as to be symmetrical with respect to the normal S that divides the source interconnect substrate 25 in the longer-side direction thereof into two equal parts (needless to say, the surface-mounted component portions have to be formed in appropriate positions).

This embodiment deals with a case in which the conductor traces are formed in the source interconnect substrate 25 so as to be symmetrical with respect to the normal S. The layout of the conductor traces is not limited to this specific layout. The invention may be practiced in any other manner than specifically described above, with any modification or variation made within the spirit of the invention. For example, the conductor traces may be formed in the source interconnect substrate 25 so as to be asymmetrical with respect to the normal S by dividing them into two groups, of which one is a group of conductor traces connected to the connector portion 31a and the terminating resistor portion 33b, and the other is a group of conductor traces connected to the connector portion 31b and the terminating resistor portion 33a.

This embodiment deals with a case in which a common structure is adopted as the structure of the two interconnect substrates disposed side by side along one side of the liquid crystal cell 7 running in the longer-side direction thereof. It is needless to say, however, that the present invention can also be applied to a case in which two interconnect substrates are disposed side by side along one side of the liquid crystal cell 7 running in the shorter-side direction thereof.

By using the interconnect substrate of the present invention for use in a liquid crystal module, it is possible to reduce the number of parts required for producing the liquid crystal module. Therefore, the present invention is useful in increasing the efficiency of producing liquid crystal modules and achieving cost reduction.

What is claimed is:

1. An interconnect substrate for use in a liquid crystal module, comprising:
    conductor traces interconnecting a driver substrate on which a driver element for driving a liquid crystal cell is mounted and a controller substrate on which a control circuit for controlling the driver element is mounted;
    a connector portion having a connector pattern that provides electrical connection between the interconnect substrate and the controller substrate; and
    a plurality of connection portions that provide connection between the interconnect substrate and the driver substrate,
    wherein the interconnect substrate is nearly rectangular in shape as seen in a plan view,
    wherein the connector portion comprises two connector portions, one for each end of the interconnect substrate in a longer-side direction thereof,
    wherein the plurality of connection portions are formed along one side of the interconnect substrate running in the longer-side direction thereof so as to be symmetrical with respect to a normal that divides the one side into two equal parts,
    wherein the conductor traces are formed so as to be able to interconnect the driver substrate and the controller substrate regardless of which of the two connector portions is used.

2. The interconnect substrate of claim 1,
    wherein the conductor traces are formed so as to be symmetrical with respect to the normal.

3. The interconnect substrate of claim 1,
    wherein terminating resistor portions, each having a terminating resistor disposed therein and connected to ends of the conductor traces, are provided one for each end of the interconnect substrate in the longer-side direction thereof.

4. The interconnect substrate of claim 1,
    wherein a screw hole is formed so as to allow the interconnect substrate to be secured by a screw to part of components constituting a liquid crystal module,
    wherein the screw hole comprises a plurality of screw holes, so as to allow the interconnect substrate to be secured by a screw regardless of whether the interconnect substrate is disposed in a first position in which one of the two connector portions is used or in a second position in which another of the two connector portions is used.

5. The interconnect substrate of claim 2,
    wherein terminating resistor portions, each having a terminating resistor disposed therein and connected to ends of the conductor traces, are provided one for each end of the interconnect substrate in the longer-side direction thereof.

6. The interconnect substrate of claim 2,
    wherein a screw hole is formed so as to allow the interconnect substrate to be secured by a screw to part of components constituting a liquid crystal module,
    wherein the screw hole comprises a plurality of screw holes, so as to allow the interconnect substrate to be secured by a screw regardless of whether the interconnect substrate is disposed in a first position in which one of the two connector portions is used or in a second position in which another of the two connector portions is used.

7. The interconnect substrate of claim 3,
    wherein a screw hole is formed so as to allow the interconnect substrate to be secured by a screw to part of components constituting a liquid crystal module,
    wherein the screw hole comprises a plurality of screw holes, so as to allow the interconnect substrate to be secured by a screw regardless of whether the interconnect substrate is disposed in a first position in which one of the two connector portions is used or in a second position in which another of the two connector portions is used.

8. The interconnect substrate of claim 5,
    wherein a screw hole is formed so as to allow the interconnect substrate to be secured by a screw to part of components constituting a liquid crystal module,
    wherein the screw hole comprises a plurality of screw holes, so as to allow the interconnect substrate to be secured by a screw regardless of whether the interconnect substrate is disposed in a first position in which one of the two connector portions is used or in a second position in which another of the two connector portions is used.

9. A liquid crystal module, comprising the interconnect substrate of claim 1.

10. A liquid crystal module, comprising the interconnect substrate of claim 2.

11. A liquid crystal module, comprising the interconnect substrate of claim 3.

12. A liquid crystal module, comprising the interconnect substrate of claim 4.

13. The liquid crystal module of claim 9, comprising:
    a liquid crystal cell that is nearly rectangular in shape, wherein the interconnect substrate comprises two interconnect substrates disposed side by side along one side of the liquid crystal cell running in a longer-side direction thereof.

14. The liquid crystal module of claim 10, comprising:
a liquid crystal cell that is nearly rectangular in shape,
wherein the interconnect substrate comprises two interconnect substrates disposed side by side along one side of the liquid crystal cell running in a longer-side direction thereof.

15. The liquid crystal module of claim 11, comprising:
a liquid crystal cell that is nearly rectangular in shape, wherein the interconnect substrate comprises two interconnect substrates disposed side by side along one side of the liquid crystal cell running in a longer-side direction thereof.

16. The liquid crystal module of claim 12, comprising:
a liquid crystal cell that is nearly rectangular in shape,
wherein the interconnect substrate comprises two interconnect substrates disposed side by side along one side of the liquid crystal cell running in a longer-side direction thereof.

* * * * *